United States Patent
Wohlmuth

(10) Patent No.: US 11,355,586 B2
(45) Date of Patent: Jun. 7, 2022

(54) HETEROJUCTION BIPOLAR TRANSISTOR

(71) Applicant: Walter Tony Wohlmuth, Taipei (TW)

(72) Inventor: Walter Tony Wohlmuth, Taipei (TW)

( * ) Notice: Subject to any disclaimer, the term of this patent is extended or adjusted under 35 U.S.C. 154(b) by 0 days.

(21) Appl. No.: 17/077,349

(22) Filed: Oct. 22, 2020

(65) Prior Publication Data
US 2022/0130960 A1  Apr. 28, 2022

(51) Int. Cl.
*H01L 29/08* (2006.01)
*H01L 29/737* (2006.01)

(52) U.S. Cl.
CPC ...... *H01L 29/0821* (2013.01); *H01L 29/0817* (2013.01); *H01L 29/737* (2013.01)

(58) Field of Classification Search
CPC .............. H01L 29/737; H01L 29/7371; H01L 29/66242; H01L 29/0817; H01L 29/0821
See application file for complete search history.

(56) References Cited

U.S. PATENT DOCUMENTS

| | | | | |
|---|---|---|---|---|
| 5,445,976 A | * | 8/1995 | Henderson | H01L 29/0649 148/DIG. 72 |
| 5,493,577 A | * | 2/1996 | Choquette | H01L 33/105 257/E33.069 |
| 2002/0117685 A1 | * | 8/2002 | Mochizuki | H01L 29/7327 257/198 |

* cited by examiner

*Primary Examiner* — Syed I Gheyas
(74) *Attorney, Agent, or Firm* — Rosenberg, Klein & Lee

(57) ABSTRACT

A heterojunction bipolar transistor, comprising: a substrate, having a first surface and an opposite second surface; a sub-emitter layer arranged on the first surface; a compound emitter layer arranged on the sub-emitter layer, making the sub-emitter layer and the compound emitter layer forms an emitter layer; a base layer arranged on the compound emitter layer; a collector ledge layer arranged on the base layer; a collector layer arranged on the collector ledge layer; a lateral oxidation region arranged on the compound emitter layer forming a current blocking region, and the outer region of the compound emitter layer surrounds inner region, so that the inner region of the compound emitter layer forms a current aperture.

18 Claims, 14 Drawing Sheets

HETEROJUCTION BIPOLAR TRANSISTOR

BACKGROUND OF THE INVENTION

1. Field of the Invention

The invention relates to a heterojunction bipolar transistor, specifically one that has a collector arranged on the top and an emitter arranged on the bottom.

2. Description of the Related Art

A heterojunction bipolar transistor, HBT, having an emitter, a base and a collector, with the emitter typically located on the top. By applying voltages Vce and Vbe, electrons are injected from the emitter, and before injecting into the collector, the electrons transit through the base layer. Heat is generated during the electron flow from the emitter to the collector. The gain, maximum frequency of oscillation and the bandwidth is highly dependent on the Base-Collector capacitance, so reducing the Base-Collector capacitance is a primary objective of the present invention.

SUMMARY OF THE INVENTION

It is a primary objective of the present invention to provide a heterojunction bipolar transistor that can improve the large-signal, radio frequency (RF) performance and enable RF transistors and power amplifiers to have better gain, maximum frequency of oscillation ($f_{max}$) and bandwidth by reducing the Base-Collector capacitance.

It is another objective of the present invention to provide a heterojunction bipolar transistor that improves the thermal performance, so as to reduce the thermal energy and improve the stability and large-signal RF performance.

It is another objective of the present invention to provide a heterojunction bipolar transistor that reduces the size of the power amplifier, so as to cut the cost of discrete RF devices and integrated circuits.

In order to achieve the above objectives, the present invention includes: a substrate having a first surface and a second surface on the opposite side; a sub-emitter layer located on the first surface of the substrate; a compound emitter layer located on the sub-emitter layer; the sub-emitter layer and the first emitter layer, forms an emitter layer; a base layer located on the emitter layer; a collector ledge layer located on the base layer; a collector layer located on the collector ledge layer; and a lateral oxidation region provided in the outer region of the first emitter layer forming a current blocking region, and the outer region of the compound emitter layer surrounds the inner region of the compound emitter layer, so that the inner region of the compound emitter layer forms a current aperture.

Moreover, the compound emitter layer is composed of a first emitter layer and a second emitter layer, and the second emitter layer is arranged on the first emitter layer.

Moreover, the first emitter layer includes a first emitter transition layer, an intermediate layer, and a second emitter transition layer, and the first emitter transition layer is made of N⁻GaAs, the second emitter transition layer is made of N⁻GaAs and the material of the intermediate layer is high Aluminum content $Al_xGa_{1-x}As$, and the lateral oxidation region is provided in the intermediate layer, and the lateral oxidation region is N⁻$Al_xGa_{1-x}As$. The high Aluminum content $Al_xGa_{1-x}As$ has an Aluminum content x ranging from 0.80 to 0.98.

Also, a first optional layer is provided between the first emitter transition layer and the intermediate layer, a second optional layer is provided between the second emitter transition layer and the intermediate layer, and the first optional layer and the second optional layer are made of N⁻AlGaAs.

Also, the thickness of the first emitter transition layer is 20-100 nm, and the doping material is Si and the Si doping concentration is graded from 4e18 to 3e17 $cm^{-3}$; the thickness of the lateral oxidation region is 0.4-2.5 nm, and the doping material is Si and the Si doping concentration is 0-6e18 $cm^{-3}$; the thickness of the second emitter transition layer is 20-100 nm, and the doping material is Si and the Si doping concentration is 5e16-5e17 $cm^{-3}$.

Also, the collector ledge layer is ordered N⁻InGaP and the energy band gap is approximately 1.85 eV.

Also, the thickness of the first emitter transition layer is 50 nm, and the doping material is Si and the Si doping concentration is graded from 4e18 to 3e17 $cm^{-3}$; the thickness of the lateral oxidation region is him, and the doping material is Si and the Si doping concentration is 4e18 $cm^{-3}$; the thickness of the second emitter transition layer is 50 nm, and the doping material is Si and the Si doping concentration is 3e17 $cm^{-3}$.

Also, the present invention includes a base metal arranged on the collector ledge layer, and the base metal diffuses down through the collector ledge layer to the base layer.

Also, the present invention includes a base metal arranged on the collector ledge layer, a etch through the collector ledge into the base layer is performed, and a base metal is deposited inside the etched region to connect to the base layer.

Also, the material of the base layer is P⁺GaAs, P⁺InGaAs, or a combination thereof.

Also, the present invention includes a collector cap layer arranged on the collector layer.

Also, the material of the substrate is semi-insulating GaAs; the material of the sub-emitter layer is N⁺GaAs; the material of the second emitter layer is N⁻InGaP; the material of the base layer is of P⁺GaAs; the material of the collector ledge layer is N⁻InGaP; the material of the collector layer is N⁻GaAs; the material of the collector cap layer is N⁺GaAs or N⁺InGaAs.

Also, the thickness of the sub-emitter layer is 500-1000 nm, and the doping material is Si and the Si doping concentration is 1e18-2e19 $cm^{-3}$; the thickness of the second emitter layer is 30-60 nm, and the doping material is Si and the Si doping concentration is 5e16-5e17 $cm^{-3}$; the thickness of the base layer is 40-120 nm, and the doping material is C and the C doping concentration is 1e19-1e20 $cm^{-3}$; the thickness of the collector ledge layer is 0.4-100 nm, and the doping material is Si and the Si doping concentration is 5e16-5e17 $cm^{-3}$; the collector layer is composed of a first collector layer and a second collector layer, and the thickness of the first collector layer is 300-1200 nm, and the doping material is Si and the Si doping concentration is 1e17-2e14 $cm^{-3}$, the thickness of the second collector layer is 0-800 nm, and the doping material is Si and the Si doping concentration is 1e16-1e17 $cm^{-3}$; a collector transition layer further extends from the second collector layer, the thickness of the collector transition layer is 20-100 nm, and the doping material is Si and the Si doping concentration is larger than 1e19 $cm^{-3}$, the collector cap layer further extends from the collector transition layer and the thickness of the collector cap layer is 20-100 nm, and the doping material is Si and the Si doping concentration is larger than 1e19 $cm^{-3}$.

Also, the thickness of the sub-emitter layer is 800 nm, and the doping material is Si and the Si doping concentration is $4e18$ $cm^{-3}$; the thickness of the second emitter layer is 50 nm, and the doping material is Si and the Si doping concentration is $3e17$ $cm^{-3}$; the thickness of the base layer is 80 nm, and the doping material is C and the C doping concentration is $3e19$ $cm^{-3}$; the thickness of the collector ledge layer is 5 nm, and the doping material is Si and the Si doping concentration is $3e17$ $cm^{-3}$; the collector layer is composed of a first collector layer and a second collector layer, and the thickness of the first collector layer is 900 nm, and the doping material is Si and the Si doping concentration is $2e15$ $cm^{-3}$, the thickness of the second collector layer is 300 nm, and the doping material is Si and the Si doping concentration is $5e16$ $cm^{-3}$; the collector transition layer further extends the second collector layer, the thickness of the collector transition layer is 50 nm, and the doping material is Si and the Si doping concentration is larger than $1e19$ $cm^{-3}$, the collector cap layer further extends the collector transition layer and the thickness of the collector cap layer is 50 nm, and the doping material is Si and the Si doping concentration is larger than $1e19$ $cm^{-3}$.

Also, at the junction of the base layer and the second emitter layer, the $N^-$InGaP of the second emitter layer is disordered or ordered.

Also, an isolation implant region is formed in the sub-emitter layer and the substrate.

Also, the isolation implant region is composed of implanted ions of Boron, Argon, Hydrogen, Helium, Aluminum, or a combination thereof.

Also, the collector layer and the collector cap layer form a first mesa; the collector ledge layer, the base layer, the second emitter layer and the first emitter layer form a second mesa, and the first mesa is smaller than the second mesa; an emitter metal located on the sub-emitter layer; a base metal located on the collector ledge layer and the base metal diffuses down through the collector ledge layer into the base layer; and a collector metal located on the collector cap layer; whereby the electron current is emitted from the emitter metal to the collector metal, and the current blocking region blocks the current, which only allows the current flow through the current aperture.

Also, a back-side metal is formed on the second surface of the substrate, and the substrate and the sub-emitter layer have a back-side via hole for making an electrical connection of the back-side metal to the emitter metal through the back-side via hole.

Also, an optional under bump metal is directly connected to the collector metal whereby the heat flow emitted from the heterojunction bipolar transistor can be conducted through the under bump metal into a bump. The bump may be a solder bump, a flip-chip bump or various other bump technologies.

With the features disclosed above, the present invention is a significant advancement beyond the prior art, as follows:

First, advances have been made in the field of Vertical Cavity Surface Emitting Laser, VCSEL, technology wherein one can now accurately control the distance of the lateral oxidation regions, uniformity and repeatability, and the high Aluminum content AlGaAs includes $Al_xGa_{1-x}As$ lateral oxidation regions with an Aluminum content x ranging from 0.80 to 0.98. These advances in lateral oxidation technology enable accurate control of the current aperture. This prevents the electrons from being injecting into the base region outside of the first mesa region where the electrons may recombine, be trapped or be collected in the base metal causing degradation of the transistor performance. The advances in lateral oxidation technology also enables the transistor to have better gain, $f_{max}$, bandwidth, power and efficiency by reducing the Base-Collector capacitance.

Second, making the base metal diffuse down through the collector ledge layer and into the base layer to form a good ohmic base contact. The lateral base metal contact to the collector ledge layer will form a Schottky contact depleting charge in the collector ledge layer and at the surface of the collector ledge layer preventing lateral current flow that can degrade transistor performance.

Third, the collector ledge layer is used to protect the base layer outside of the current aperture region by preventing the exposure of the $P^+$GaAs material of the base layer, avoiding the electrons re-combining at the surface of the base layer outside of the current aperture region, and improving the reliability and performance of the transistor. It is required that the $N^-$InGaP of the collector ledge layer to be ordered, to prevent any blocking of electron injection from the base layer into the collector layer as ordered InGaP is lattice-matched to GaAs; if the $N^-$InGaP of the collector ledge layer is disordered, then there is a conduction band spike between the $N^-$InGaP collector ledge layer and the $P^+$GaAs base layer that can block electron injection from base to collector degrading transistor performance. Electrons that recombine or are trapped outside of the current aperture region and electrons that are blocked at the conduction band spike between ordered $N^-$InGaP and $P^+$GaAs will not be collected within the collector metal and therefore the transistor performance will be degraded.

Fourth, the collector ledge layer is an etch stop layer, so that the collector layer and the collector cap layer are etched but the collector ledge layer remains mostly unetched, therefore, the $N^-$InGaP material of the collector ledge layer has high etch selectivity compared to the $N^-$GaAs of the collector layer and the $N^+$InGaAs of the collector cap layer.

DETAILED DESCRIPTION OF THE PREFERRED EMBODIMENT

Figure 1:
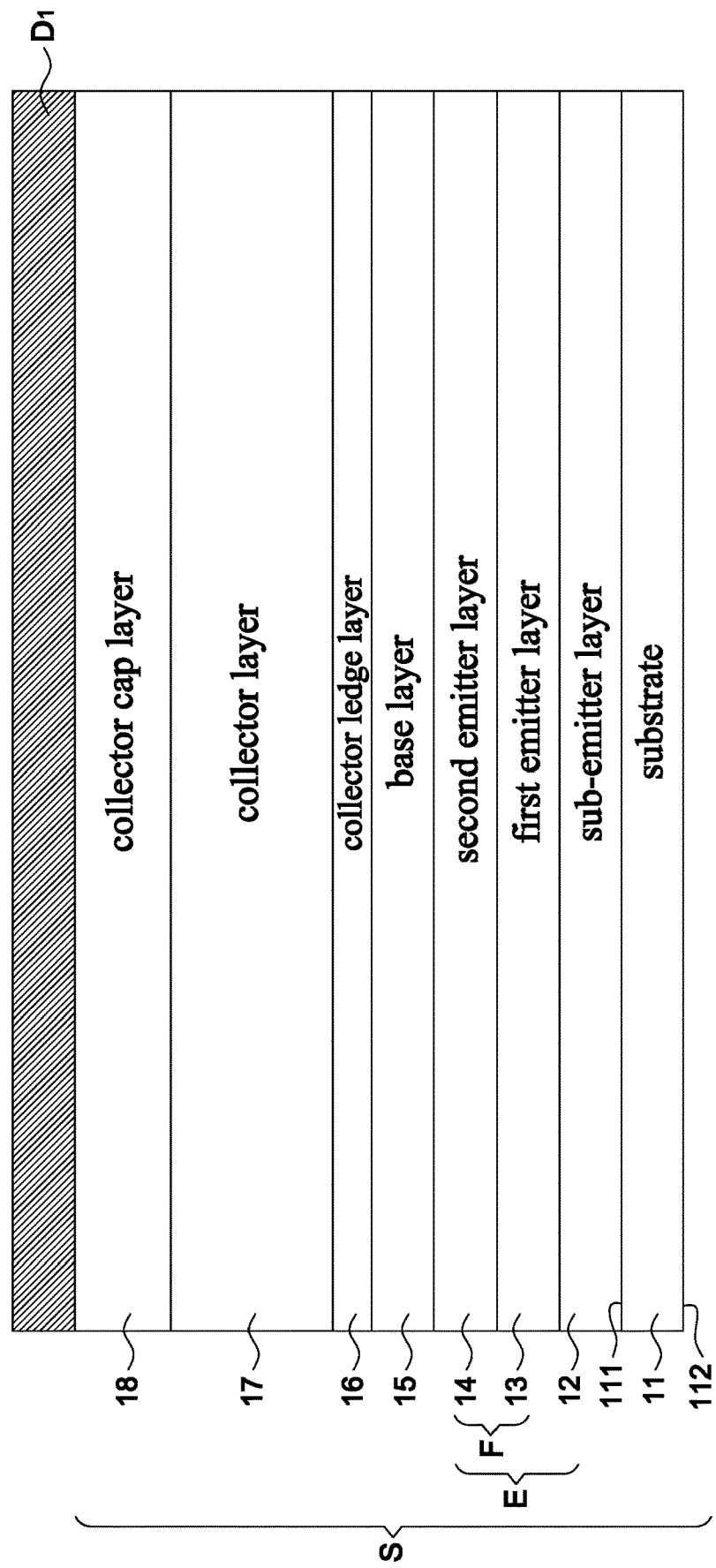
FIG. 1 is a schematic diagram illustrating structure of the present invention with a first SiN insulation layer protecting the surface of the semiconductor.

Referring to FIGS. 1-14, the present invention is a heterojunction bipolar transistor 10, comprising: a substrate 11 having a first surface 111 and a second surface 112 on the opposite side; in this embodiment, the material of the substrate 11 is semi-insulating GaAs, and the thickness of the substrate 11 is as referenced from the standard of the Semiconductor Equipment and Materials international, SEMI, and the unit is micron.

A sub-emitter layer 12 is located on the first surface 111 of the substrate 11, in this embodiment, the material of the sub-emitter layer 12 is N$^+$GaAs, and the thickness of the sub-emitter layer 12 is 500-1000 nm, and the doping material is Si and the Si doping concentration is 1e18-2e19 cm$^{-3}$; or the thickness of the sub-emitter layer is 800 nm, and the doping material is Si and the Si doping concentration is 4e18 cm$^{-3}$, but the present invention is not limited to such application.

A compound emitter layer F is located on the sub-emitter layer 12.

The sub-emitter layer 12, the compound emitter layer F forms an emitter layer E; in this embodiment, the compound emitter layer F is composed of a first emitter layer 13 and a second emitter layer 14, and second emitter layer 14 is arranged on the first emitter layer 13, the material of the second emitter layer is N$^-$InGaP and the N$^-$InGaP is disordered with 49% Indium composition and the thickness is 30-60 nm, and the doping material is Si and the Si doping concentration is 5e16-5e17 cm$^{-3}$, or the thickness of the second emitter layer 14 is 50 nm, and the doping material is Si and the Si doping concentration is 3e17 cm$^{-3}$, but the present invention is not limited to such application.

A base layer 15 is located on the compound emitter layer F, in this embodiment, the material of the base layer 15 is P$^+$GaAs, P$^+$InGaAs, or a combination thereof, the thickness of the base layer 15 is 40-120 nm, and the doping material is C and the C doping concentration is 1e19-1e20 cm$^{-3}$, or the thickness of the base layer 15 is 80 nm, and the doping material is C and the C doping concentration is 3e19 cm$^{-3}$, but the present invention is not limited to such application.

A collector ledge layer 16 is located on the base layer 15, in this embodiment, the material of the collector ledge layer 16 is N$^-$InGaP, the N$^-$InGaP is ordered with 49% Indium composition, the thickness of the collector ledge layer 16 is 0.4-100 nm, and the doping material is Si and the Si doping concentration is 5e16-5e17 cm$^{-3}$, or the thickness of the collector ledge layer 16 is 5 nm, and the doping material is Si and the Si doping concentration is 3e17 cm$^{-3}$, but the present invention is not limited to such application.

A collector layer 17, is located on the collector ledge layer 16, in this embodiment, the material of the collector layer 17 is N$^-$GaAs, and the collector layer 17 has the functions of optimizing the base-collector capacitance, the base-collector breakdown voltage, the Kirk effect, and the ruggedness of the transistor 10, but the present invention is not limited to such application.

A collector cap layer 18, is located on the collector layer 17, in this embodiment, the material of the collector cap layer 18 is N$^+$GaAs or N$^+$InGaAs, with the Indium composition greater than or equal to 50%, and the collector cap layer 18 has the function of forming a low-resistance contact to the collector metal, but the present invention is not limited to such application.

Referring to FIG. 1, the substrate 11, the sub-emitter layer 12, the compound emitter layer F, the base layer 15, the collector ledge layer 16, the collector layer 17, and the collector cap layer 18 form a semiconductor structure S, the surface of the semiconductor structure S is coated with a first SiN insulating layer $D_1$.

Figure 2:
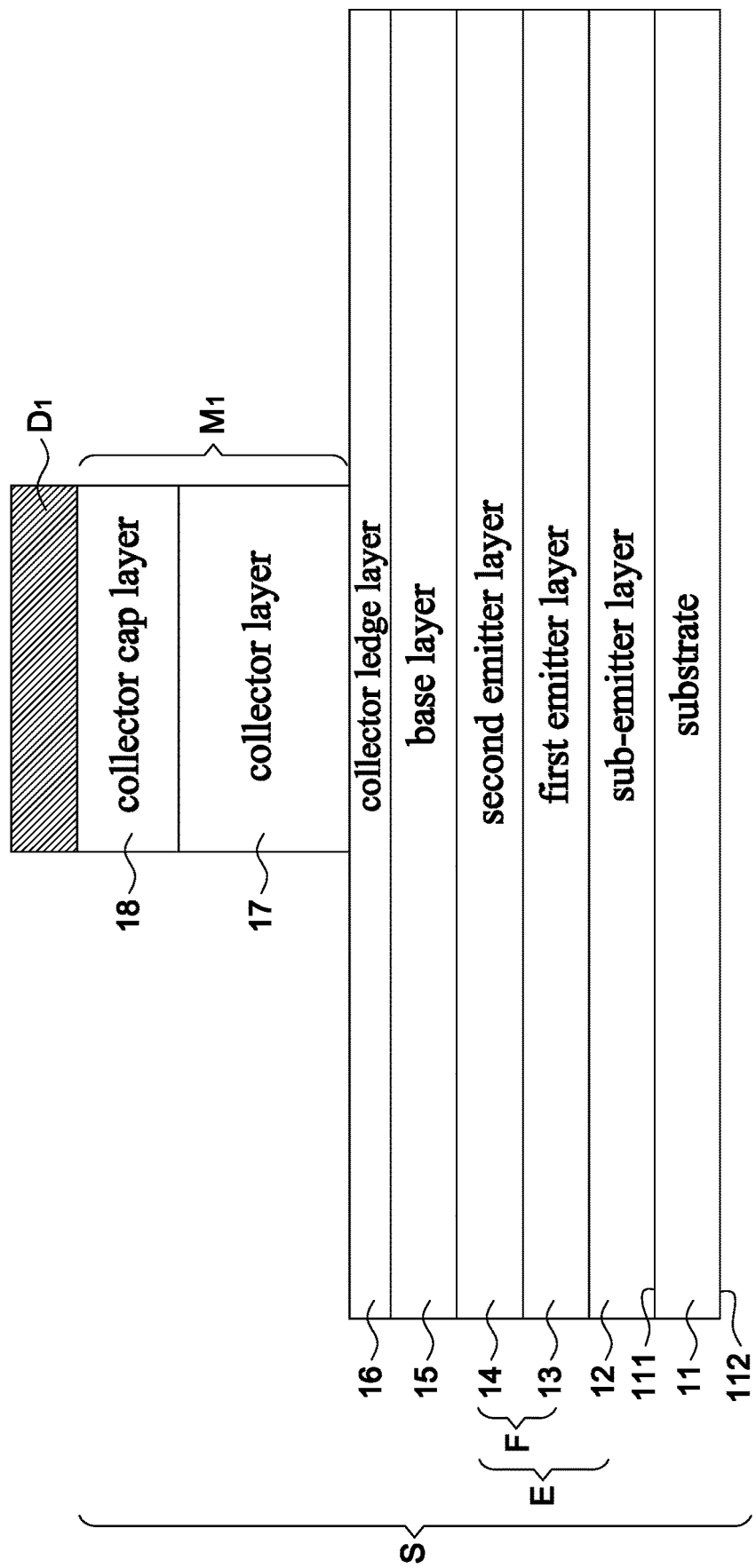
FIG. 2 is a schematic diagram illustrating the etching of the first mesa of the present invention.

Referring to FIG. 2, the first SiN insulating layer $D_1$ is patterned and etched followed by an etch through the collector layer 17 and the collector cap layer 18 with the etch stopping on the collector ledge layer 16, so the collector layer 17 and the collector cap layer 18 form a first mesa $M_1$.

Figure 3:
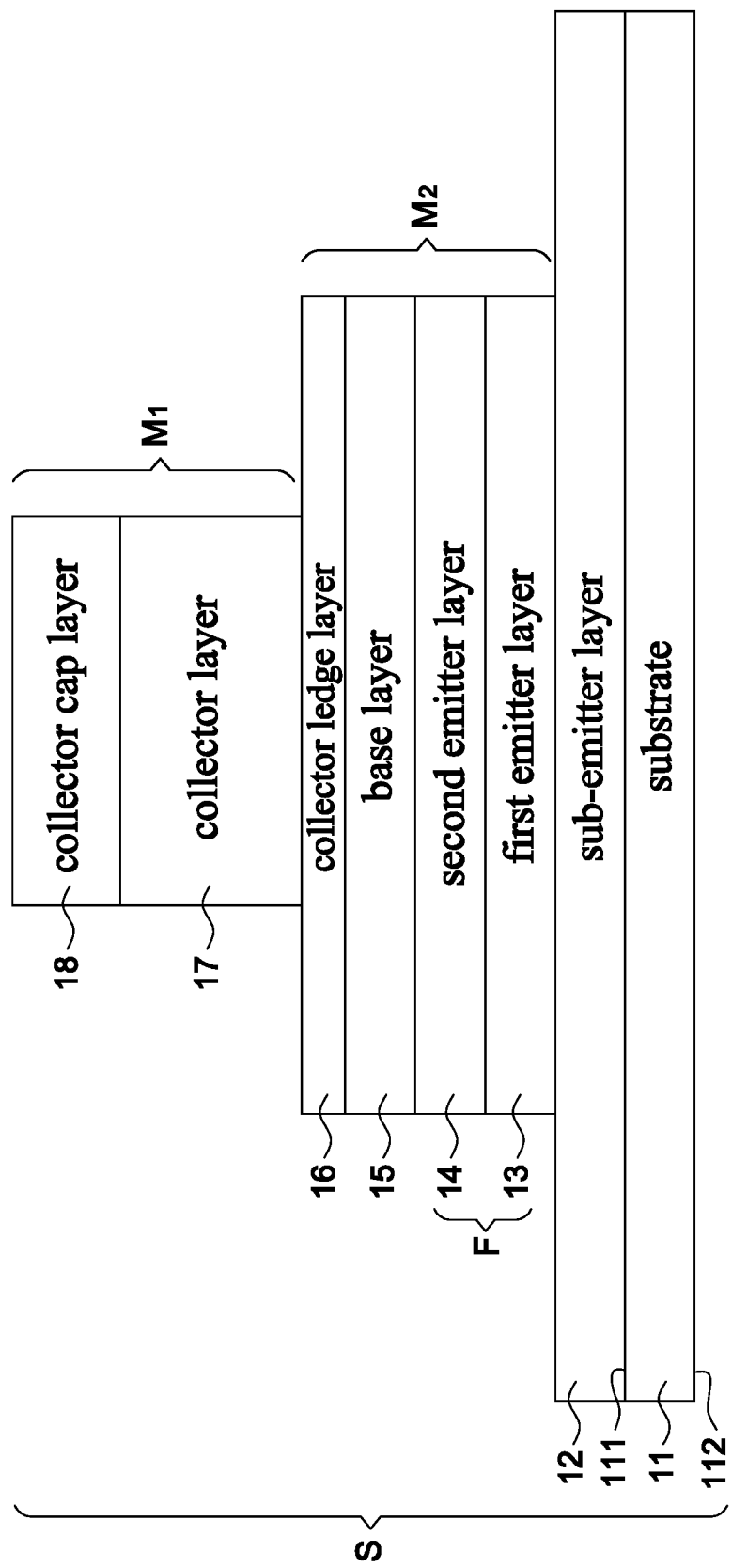
FIG. 3 is a schematic diagram illustrating the etching of the second mesa of the present invention.

Referring to FIG. 3, an etch through the collector ledge layer 16, the base layer 15 and the compound emitter layer F, to make the collector ledge layer 16, the base layer 15 and the compound emitter layer F form a second mesa $M_2$, the first mesa $M_1$ is smaller than the second mesa $M_2$.

Figure 4:
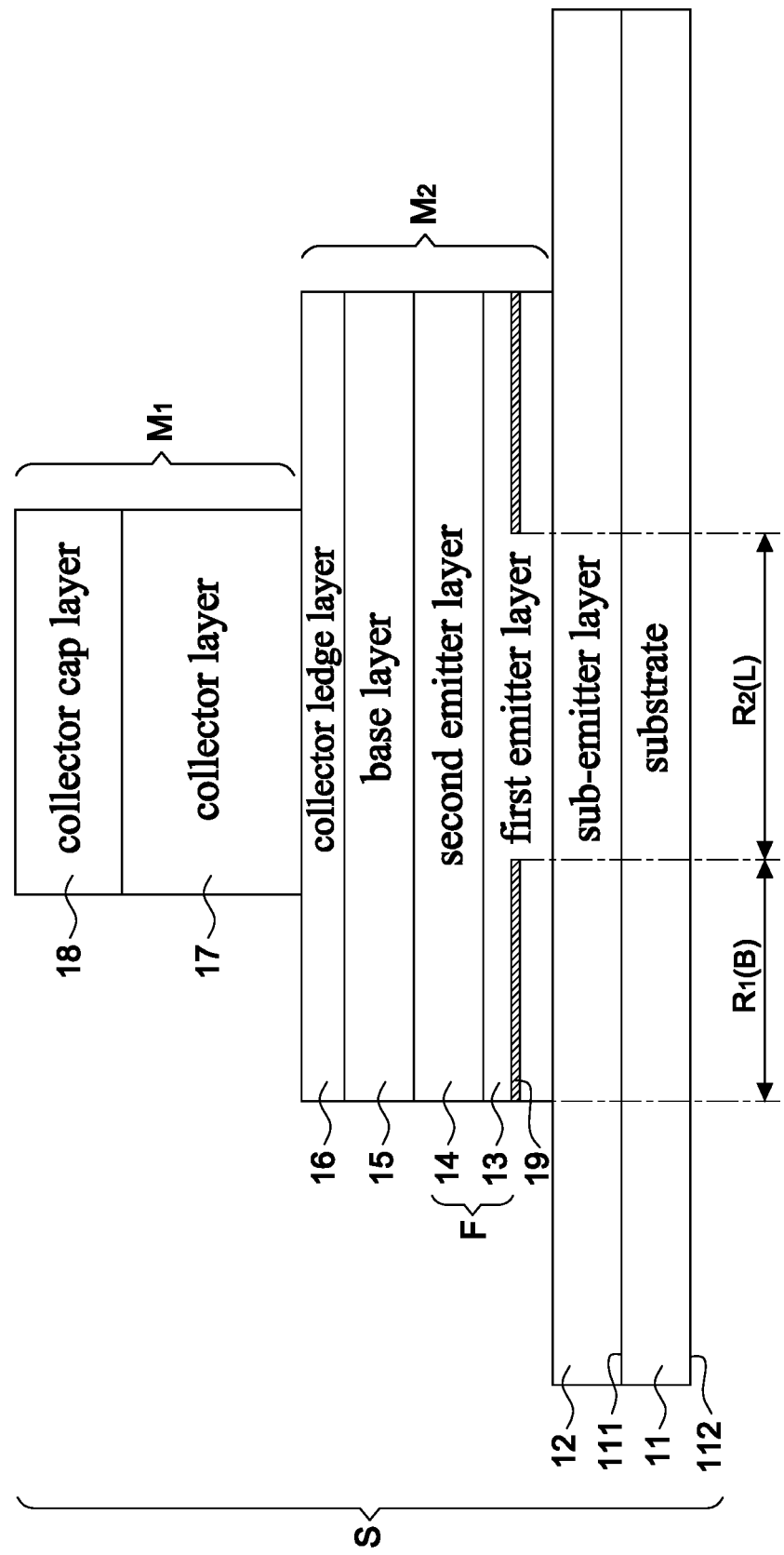
FIG. 4 is a schematic diagram illustrating the forming of the lateral oxidation region of the present invention.

Referring to FIG. 4, a lateral oxidation region 19 is forming at the outer region $R_1$ of the compound emitter layer F to form a current blocking region B, and the outer region $R_1$ of the compound emitter layer F surrounds the inner region $R_2$ of the compound emitter layer F to form a current aperture L, therefore, the present invention forms a current aperture L by the lateral oxidation of AlGaAs with high Aluminum content, the high Aluminum content $Al_xGa_{1-x}As$ has an Aluminum content x between 0.80 to 0.98.

Figure 5:
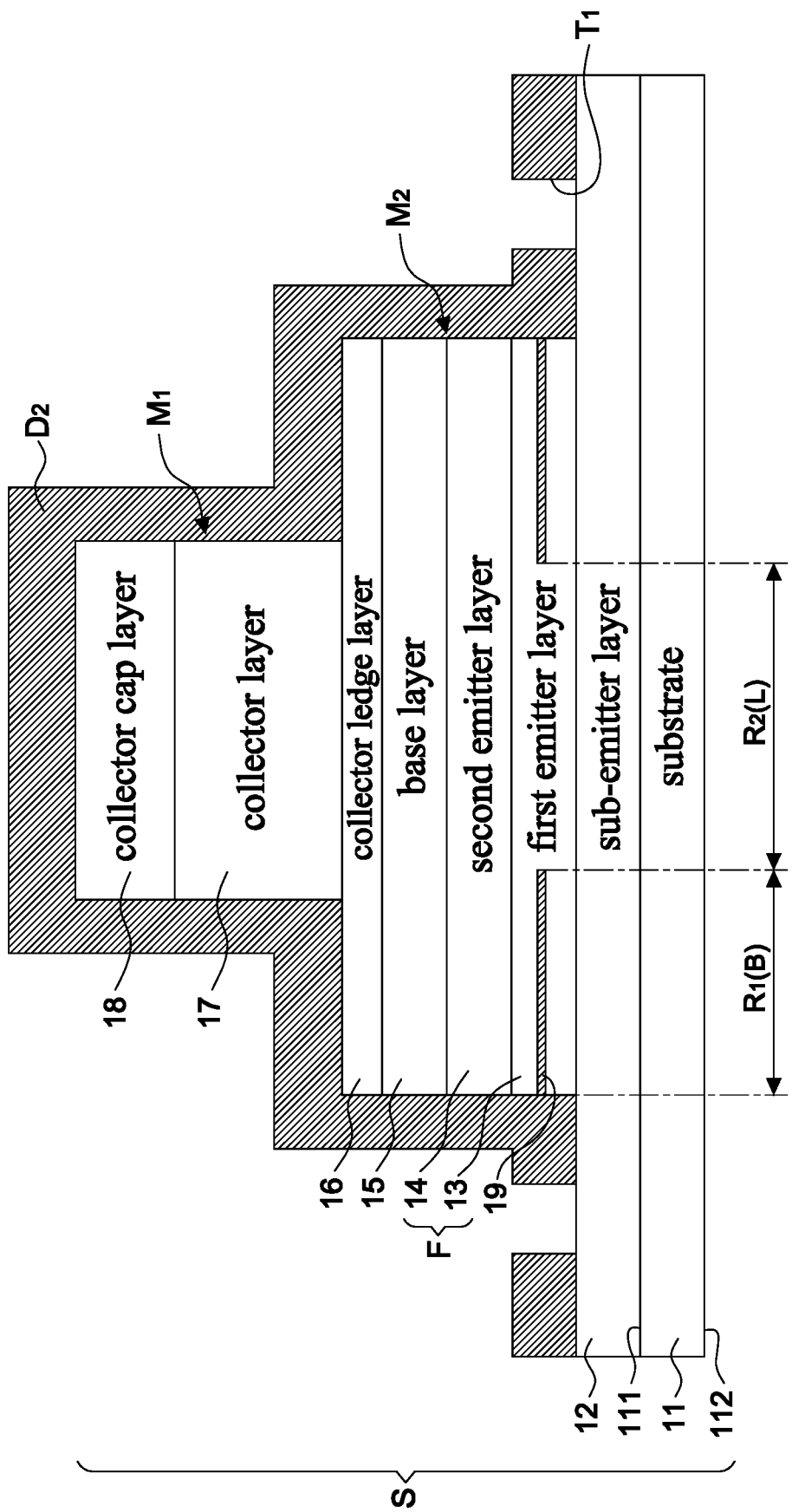
FIG. 5 is a schematic diagram illustrating the forming of the second SiN insulation layer and the etching of the first via hole of the present invention.

Referring to FIG. 5, a second SiN insulating layer $D_2$ is deposited to protect the semiconductor structure S and the lateral oxidation region 19, and a first via hole $T_1$ is etched in the second SiN insulating layer $D_2$.

Figure 6:
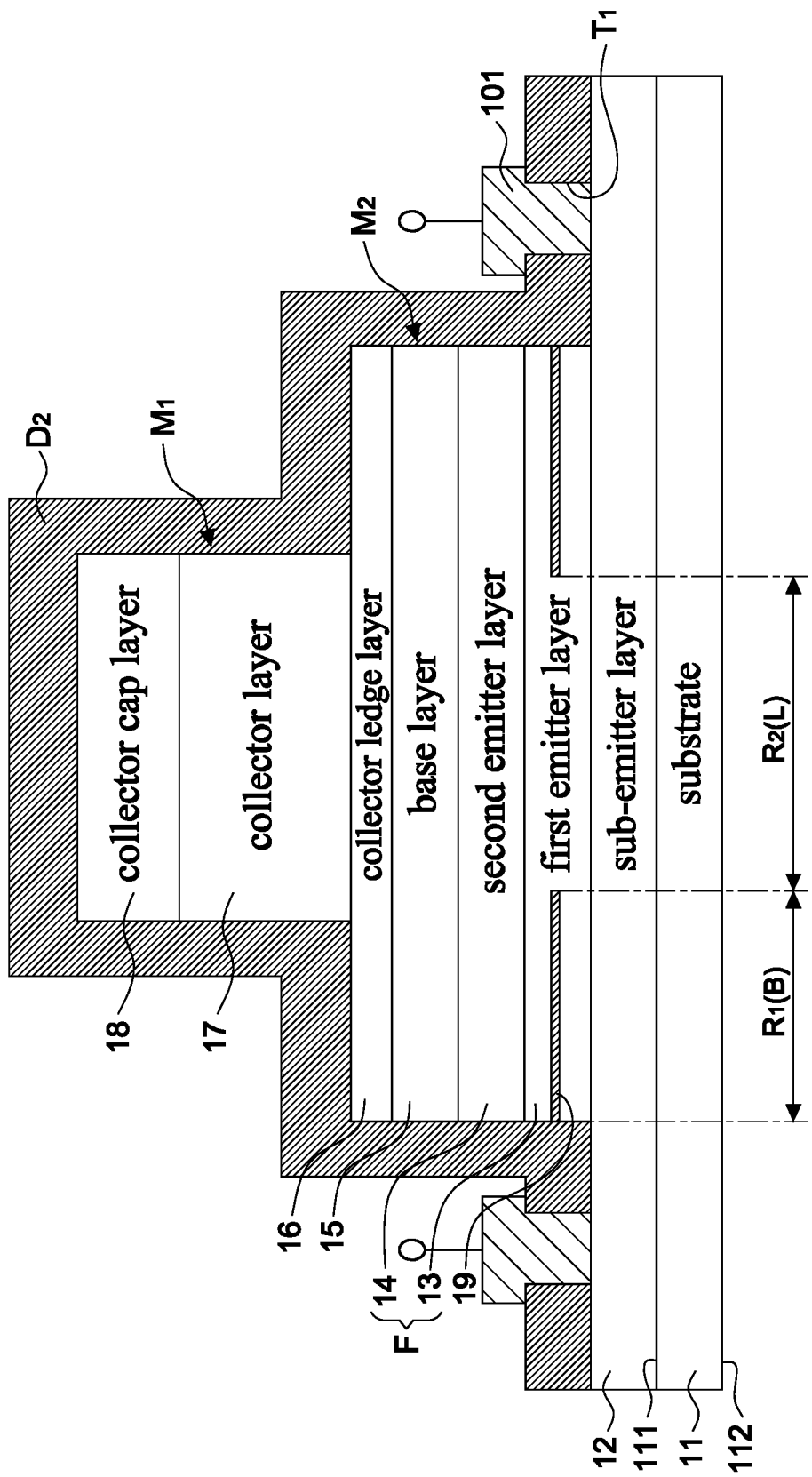
FIG. 6 is a schematic diagram illustrating the forming of the emitter metal of the present invention.

Referring to FIG. 6, an emitter metal 101 is deposited inside the first via hole $T_1$, the emitter metal 101 is formed on the sub-emitter layer 12, and the emitter metal 101 is an alloy material and the sub-emitter layer 12 is made of N$^+$GaAs for forming a good ohmic contact.

Figure 7:
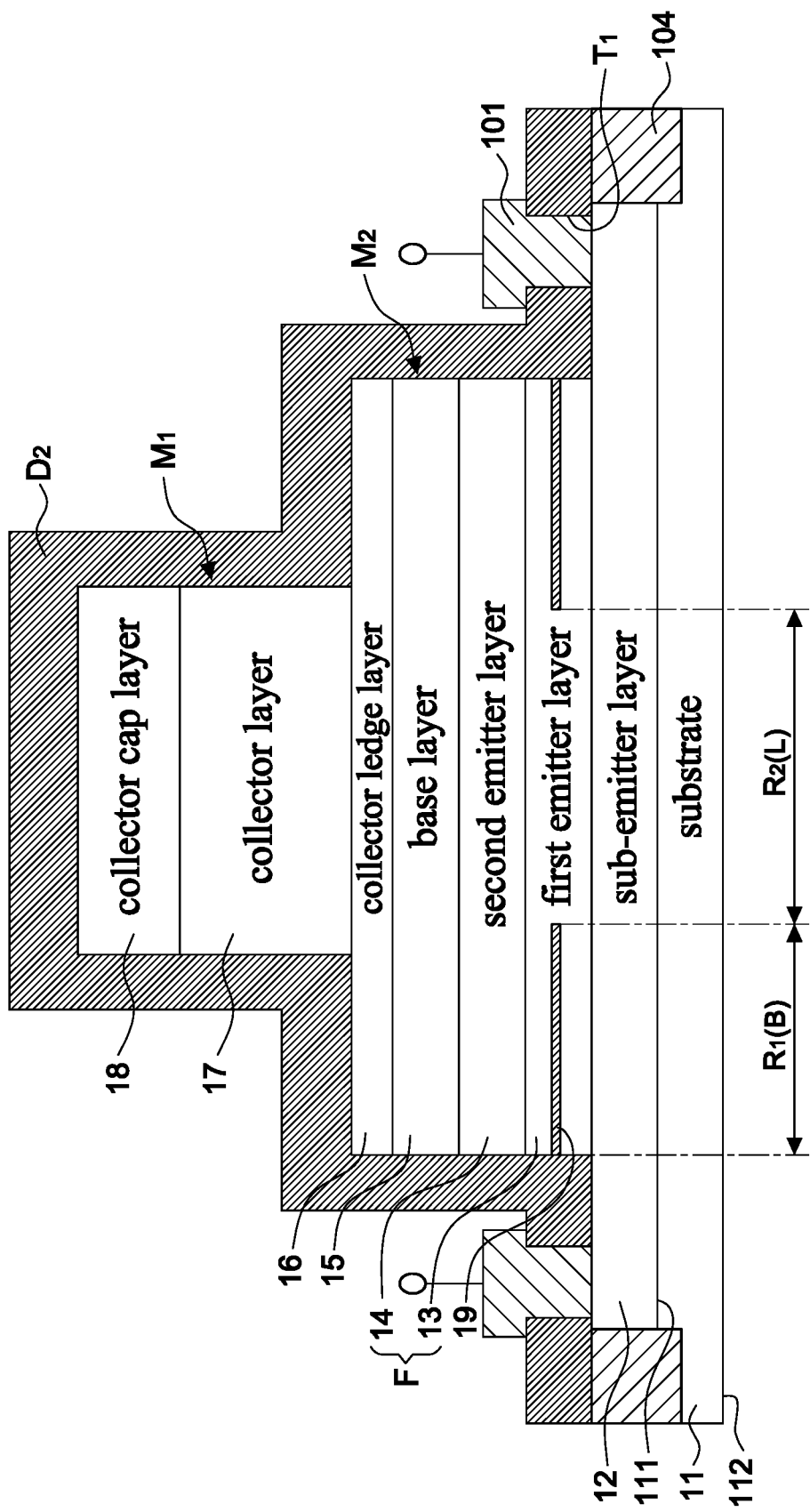
FIG. 7 is a schematic diagram illustrating the forming of the isolation implant region of the present invention.

Referring to FIG. 7, an isolation implant region 104 is formed by implanted ions going through the second SiN insulating layer $D_2$ and into the sub-emitter layer 12. The isolation implant region 104 extends through the sub-emitter layer 12 into the substrate 11. The implant region 104 will prevent current flow between adjacent devices. In this embodiment, the isolation implant region 104 is compose of Boron, Argon, Hydrogen, Helium, Aluminum, or combination thereof, but the present invention is not limited to such application.

Figure 8:
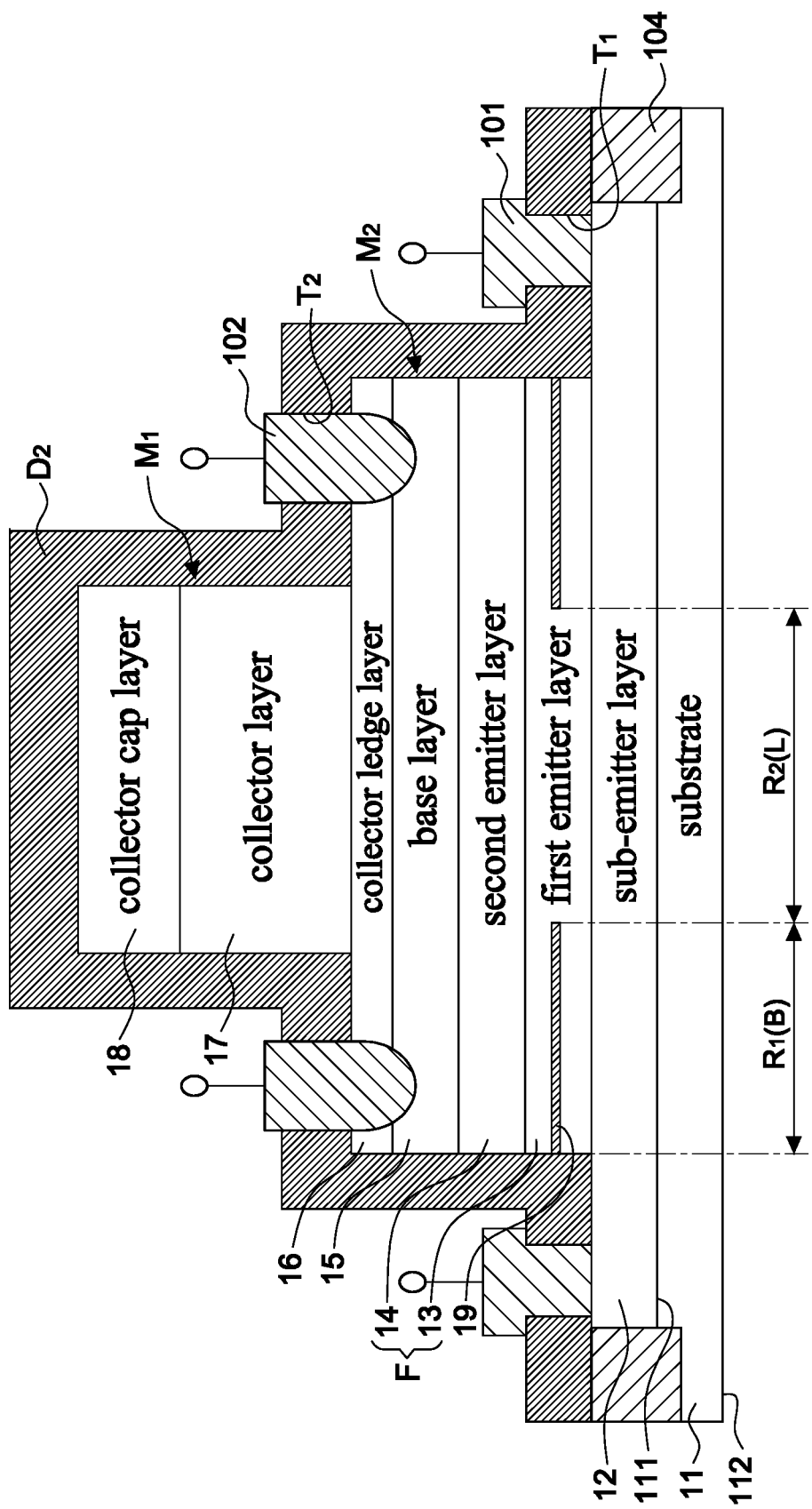
FIG. 8 is a schematic diagram illustrating the forming of the base metal of the present invention.

Referring to FIG. 8, a second via hole $T_2$ is etched through the second SiN insulating layer $D_2$, and deposit a base metal 102 is deposited inside the second via hole $T_2$, the base metal 102 is formed on the collector ledge layer 16, and is diffused down to alloy the base metal 102 from the collector ledge layer 16 to the base layer 15 forming a good ohmic base contact. The lateral base metal contact to the collector ledge layer will form a Schottky contact. The material of the collector ledge layer 16 is N$^-$InGaP and the material of the base layer 15 is P+GaAs, or the base metal 16 etch through the collector ledge 16 into the base layer 15 is performed, and a base metal 16 is deposited inside the etched region to connect to the base layer 15.

Figure 9:
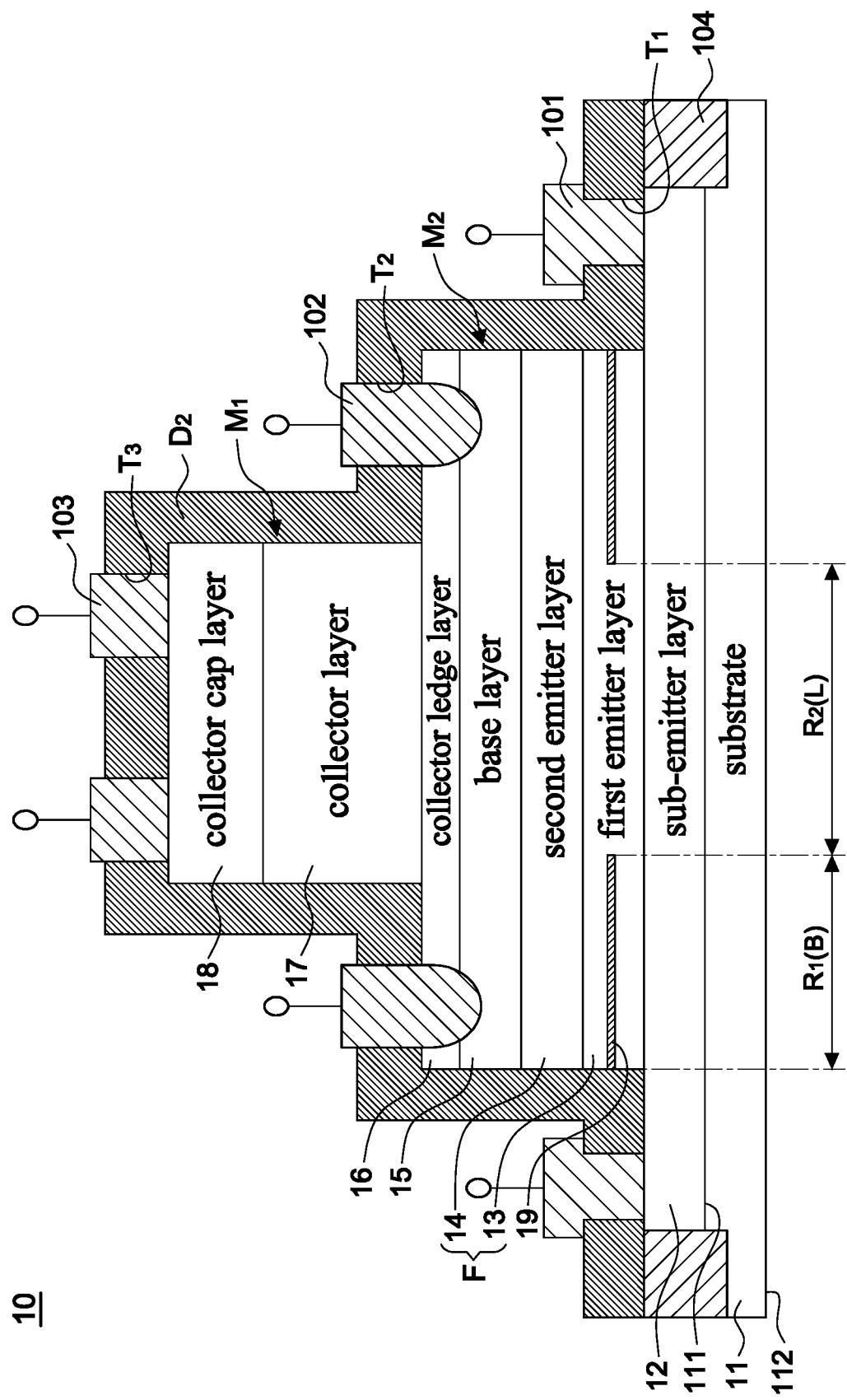
FIG. 9 is a schematic diagram illustrating the forming of the collector metal of the present invention and illustrating the finished heterojunction bipolar transistor.

Referring to FIG. 9, a third via hole $T_3$ is etched through the second SiN insulating layer $D_2$, and a collector metal 103 is deposited inside the third via hole $T_3$, the collector metal 103 is formed on the collector cap layer 18, and forms a good ohmic collector contact, the material of the collector cap layer 18 is N+InGaAs. Moreover, since the N+InGaAs is highly doped, it can be non-alloyed contact, but the present invention is not limited to such application.

Figure 10:
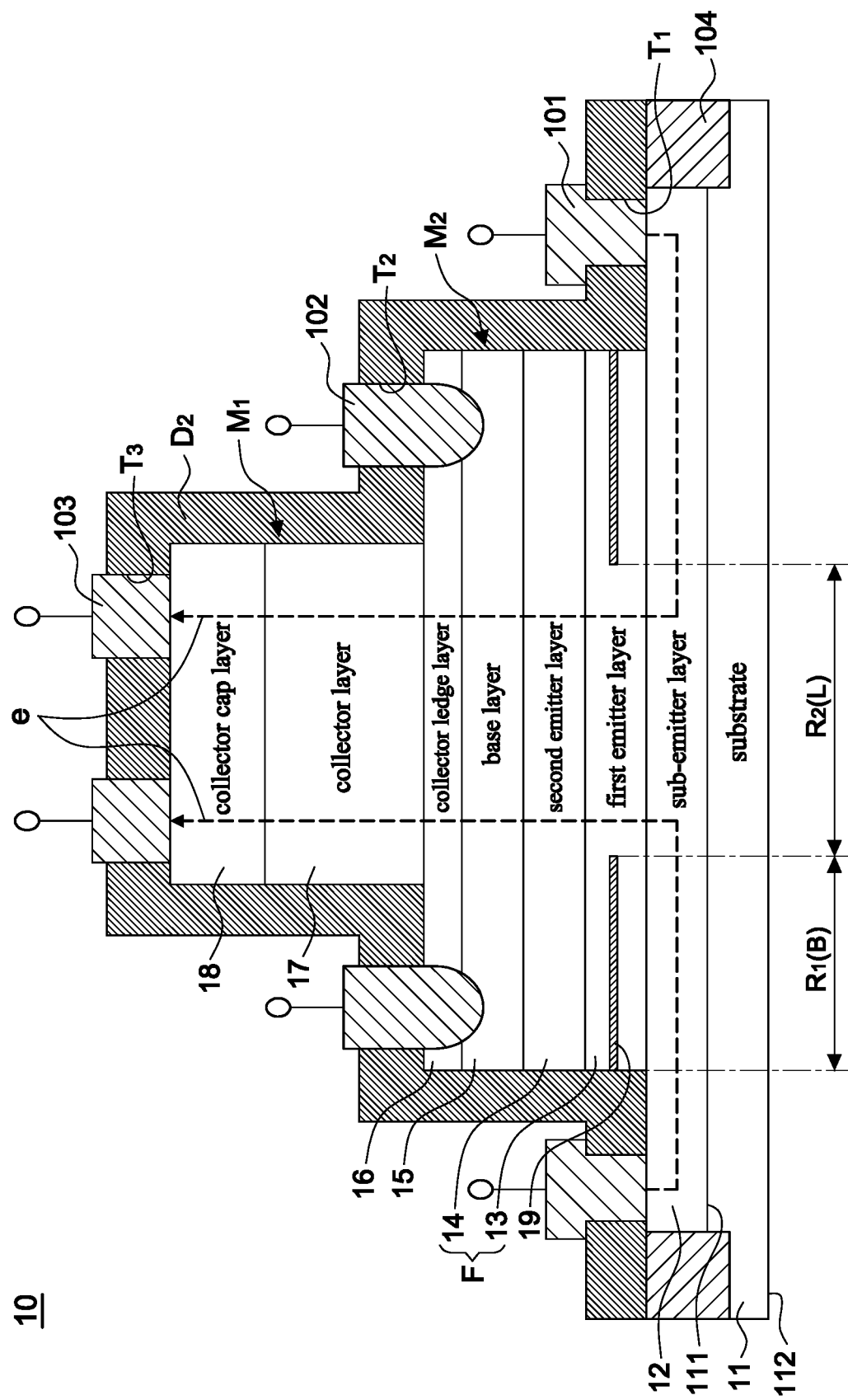
FIG. 10 is a schematic diagram illustrating the electron current flowing from the emitter metal to the collector metal of the present invention.

Referring to FIG. 9, and by the steps disclosed in FIGS. 1-9 a heterojunction bipolar transistor 10 is completed. Also, as shown in FIG. 10, the electron current flow e from the emitter metal 101 to the base metal 102, is prevented by the current blocking region B which blocks the current and only allows the current flow through the current aperture L, but the present invention is not limited to such application.

Figure 11B:
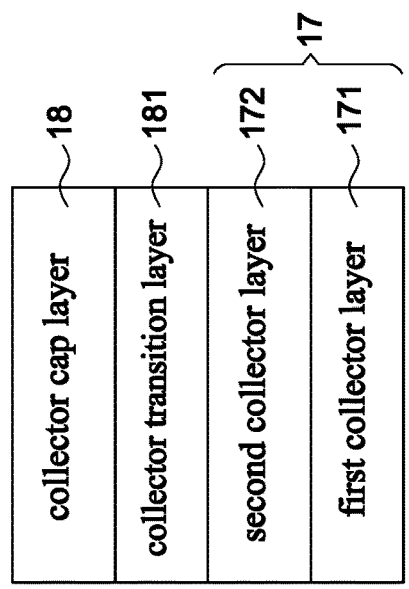
FIG. 11B is a schematic diagram illustrating the structure from the first collector layer to the collector cap layer of the present invention.
Figure 11A:
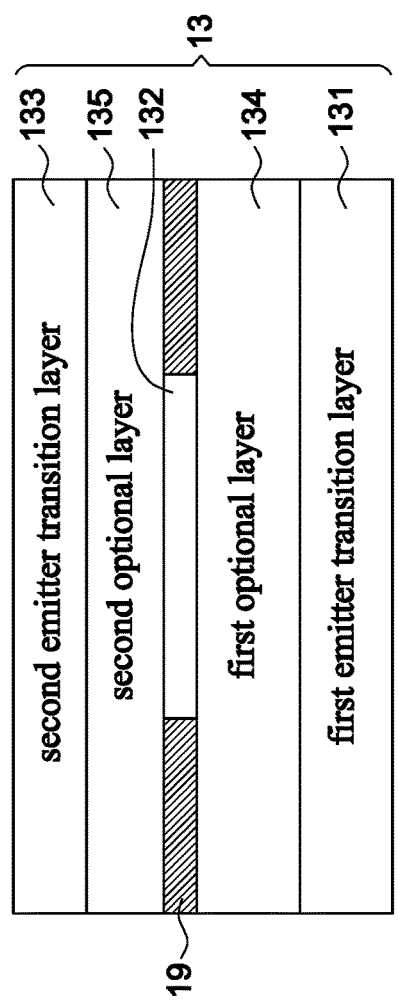
FIG. 11A is a schematic diagram illustrating the structure from the first emitter transition layer to the second emitter transition layer of the present invention.

Referring to FIG. 11A, the first emitter layer 13 includes a first emitter transition layer 131, an intermediate layer 132, and a second emitter transition layer 133, the second emitter transition layer 133 has the function of ballast resistance to improve thermal stability and RF performance of the transistor 10, and the first emitter transition layer 131 is made of N−GaAs, the second emitter transition layer 133 is made of N−GaAs and the material of the intermediate layer 132 is high Aluminum content $Al_xGa_{1-x}As$, and the lateral oxidation region 19 is provided in the intermediate layer 132, and the lateral oxidation region 19 is N−AlGaAs with Aluminum content x between 0.80-0.98, in this embodiment, the thickness of the first emitter transition layer 131 is 20-100 nm, and the doping material is Si and the Si doping concentration is reduced from 4e18 to 3e17 $cm^{-3}$; the thickness of the lateral oxidation region 19 is 0.4-2.5 nm, and the doping material is Si and the Si doping concentration is 0-6e18 $cm^{-3}$; the thickness of the second emitter transition layer 133 is 20-100 nm, and the doping material is Si and the Si doping concentration is 5e16-5e17 $cm^{-3}$; or the thickness of the first emitter transition layer 131 is 50 nm, and the doping material is Si and the Si doping concentration is reduced from 4e18 to 3e17 $cm^{-3}$; the thickness of the lateral oxidation region 19 is him, and the doping material is Si and the Si doping concentration is 4e18 $cm^{-3}$; the thickness of the second emitter transition layer 133 is 50 nm, and the doping material is Si and the Si doping concentration is 3e17 $cm^{-3}$, but the present invention is not limited to such application.

Also, a first optional layer 134 is provided between the first emitter transition layer 131 and the intermediate layer 132, and a second optional layer 135 is provided between the intermediate layer 132 and the second emitter transition layer 133. The optional layers provide a smoother conduction band transition from the N−GaAs transition layers to the high Aluminum intermediate layers. The material of the first optional layer 134 and the second optional layer 135 are N−AlGaAs, but the present invention is not limited to such application.

Furthermore, the material of the intermediate layer 132 is high Aluminum content including AlGaAs and is highly resistive, therefore, the intermediate layer 132 needs to be thin for electron tunneling. The second emitter layer 14 is used to inject electrons into the base layer 15 and form a heterojunction between the base layer 15 and the second emitter layer 14, but the present invention is not limited to such application.

Referring to FIG. 11B, the collector layer 17 is composed of a first collector layer 171 and a second collector layer 172, and the thickness of the first collector layer 171 is 300-1200 nm, and the doping material is Si and the Si doping concentration is 1e17-2e14 $cm^{-3}$, the thickness of the second collector layer 172 is 0-800 nm, and the doping material is Si and the Si doping concentration is 1e16-1e17 $cm^{-3}$; the collector cap layer 18 thickness is 20-100 nm and the doping material is Si and the doping concentration is >1e19 $cm^{-3}$; the collector transition layer 181 extends the second collector layer 172, the thickness of the collector transition layer 181 is 20-100 nm, and the doping material is Si and the Si doping concentration is larger than 1e19 $cm^{-3}$; or the collector layer 17 is composed of a first collector layer 171 and a second collector layer 172, and the thickness of the first collector layer 171 is 900 nm, and the doping material is Si and the Si doping concentration is 2e15 $cm^{-3}$, the thickness of the second collector layer 172 is 300 nm, and the doping material is Si and the Si doping concentration is 5e16 $cm^{-3}$; the collector cap layer 18 further extends a collector transition layer 181, the collector transition layer 181 further extends the second collector layer 172, the thickness of the collector transition layer 181 is 50 nm, and the doping material is Si and the Si doping concentration is larger than 1e19 $cm^{-3}$. The material of the collector transition layer 181 is N+InGaAs, and the Indium concentration is 0.50, but the present invention is not limited to such application. The material of the collector cap layer 18 is N+InGaAs and the Indium composition is 0.50 to 0.65. The thickness of the collector cap layer 18 is 50 nm, and the doping material is Si and the Si doping concentration is larger than 1e19 $cm^{-3}$.

Figure 12:
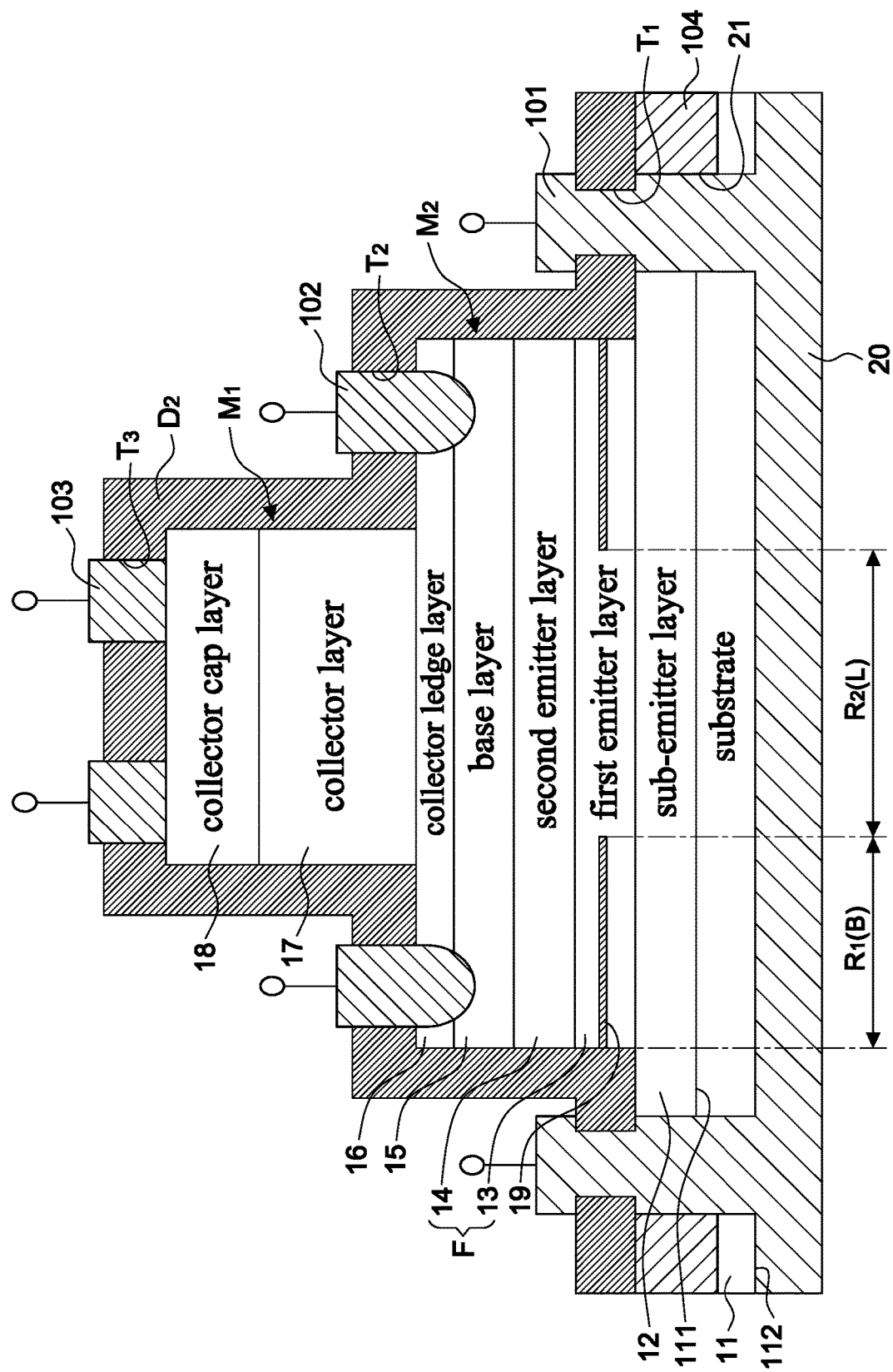
FIG. 12 is a schematic diagram illustrating the back-side metal and the back-side via hole of the present invention.
Figure 13:
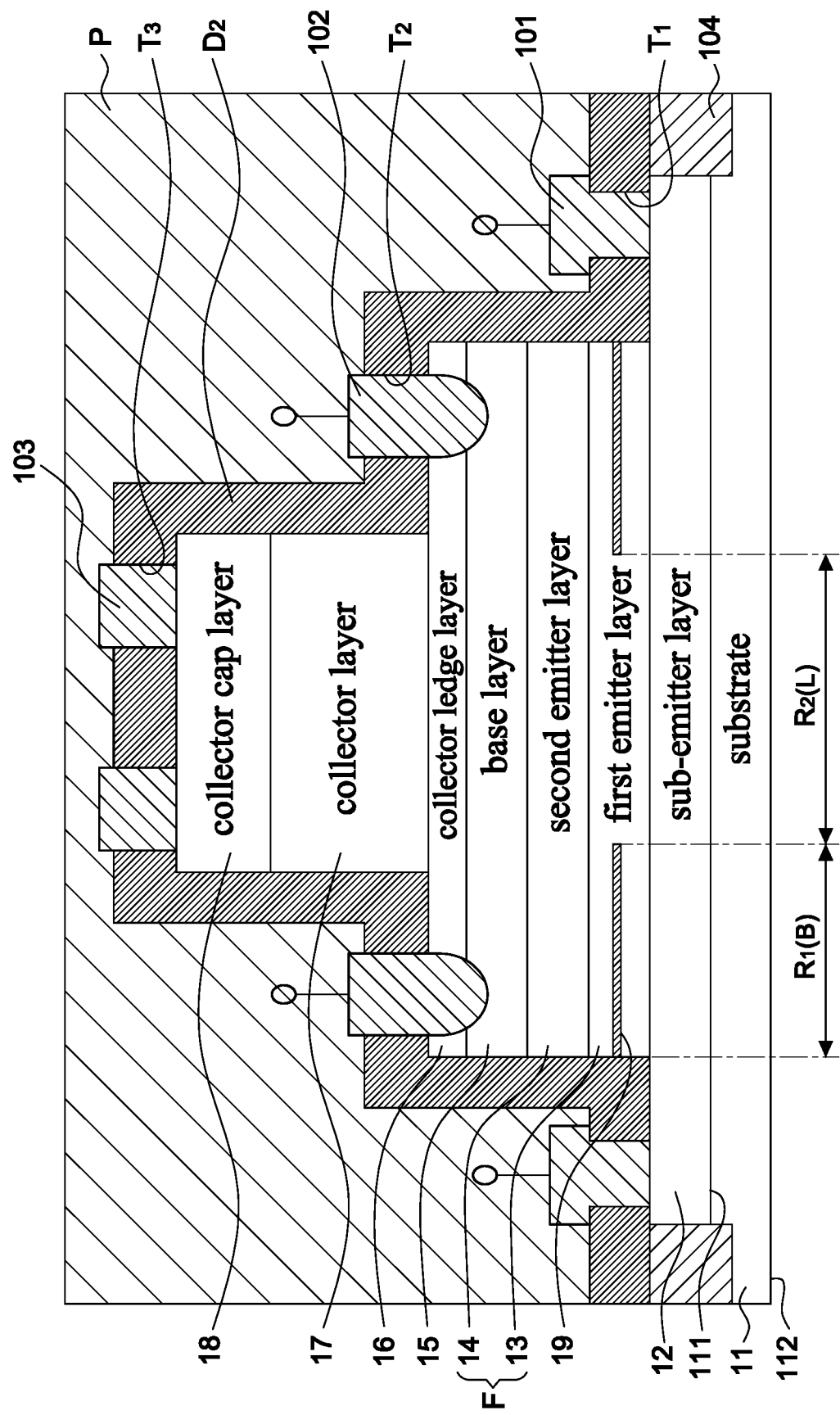
FIG. 13 is a schematic diagram illustrating an additional dielectric passivation layer that is coated on the heterojunction bipolar transistor of the present invention.
Figure 14:
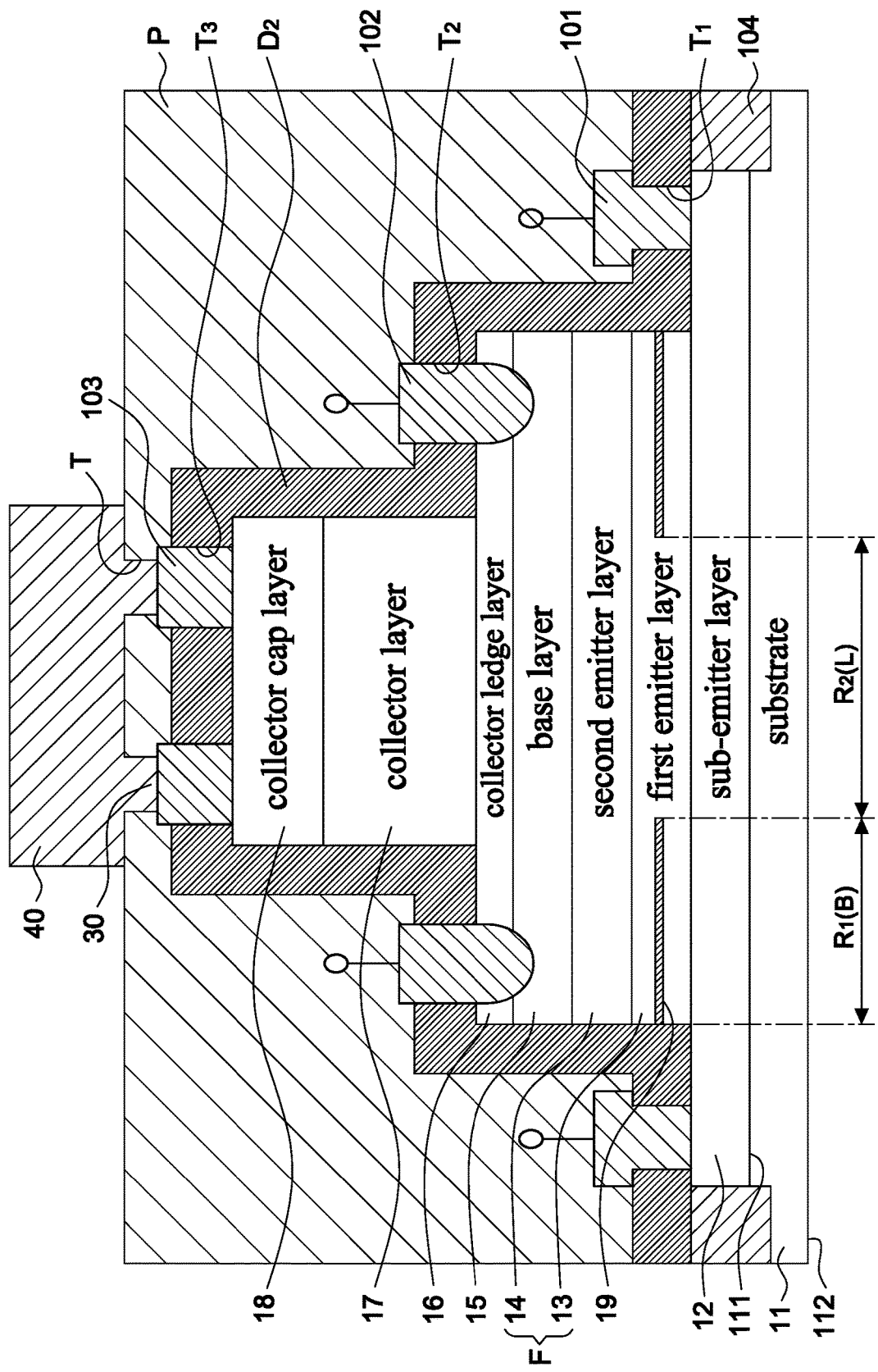
FIG. 14 is a schematic diagram illustrating an additional under bump metal and flip-chip bump, solder bump or thermal bump wherein the heat flow emitted from the heterojunction bipolar transistor being conducted through the under bump metal into the flip-chip bump, solder bump or thermal bump.

Referring to FIG. 12, in another embodiment, a back-side metal 20 is arranged on the second surface 112 of the substrate 11, and the substrate 11 and the sub-emitter layer 12 have a back-side via hole 21 for making the back-side metal 20 be electrically connected to the emitter metal 101 by the back-side via hole 21. Referring to FIGS. 13-14, in another embodiment, a dielectric passivation layer P is coated on the heterojunction bipolar transistor 10, the dielectric passivation layer P has a via hole T and within the via hole T, an under bump metal 30 is deposited which directly connects to the collector metal 103, whereby the heat flow emitted from the heterojunction bipolar transistor 10 can be conducted through the under bump metal 30 into a bump 40, in this embodiment, the bump 40 is deposited on the dielectric passivation layer P and the under bump metal 30, the bump 40 can be used as a thermal bump to improve the efficiency of removing heat and can be flip-chip mounted onto a circuit board, mounted to a board within a module or mounted or stacked on top of another die, but the present invention is not limited to such application.

Moreover, at the junction of the base layer 15 and the second emitter layer 14, the N−InGaP of the second emitter layer 14 is disordered or ordered, and the energy bandgap is between 1.85 to 1.90 eV; at the junction of the base layer 15 and the collector ledge layer 16, the N−InGaP of the collector ledge layer 16 is ordered, and the energy bandgap is approximately 1.85 eV, but the present invention is not limited to such application.

With the features disclosed above, the present invention having the collector arranged on the top, since the base-collector junction area is smaller, the capacitance of the base-collector junction is reduced. The lateral oxidation in the emitter reduces electrons to be injected outside of the current aperture resulting in better performance of the transistor 10 and also reduces the base-emitter junction area and the base-emitter junction capacitance, and the base in the lateral oxidation region 19 is protected. The collector ledge layer 16 covering the base layer 15 is used to prevent the base layer 15 from being exposed, and further prevents surface electron trapping and recombination improving the reliability of the transistor 10. The base metal 102 diffuses down through the collector ledge layer 16 to the base layer 15, thereby permitting the collector ledge layer 16 to protect the base layer 15. The N$^-$InGaP material of the collector ledge layer 16 needs to be ordered, in order to achieve no conduction band discontinuity which can block and reduce electron flow from the base to the collector.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A heterojunction bipolar transistor, comprising:
a substrate having a first surface and a second surface on the opposite side;
a sub-emitter layer located on the first surface of the substrate;
a compound emitter layer located on the sub-emitter layer for making the sub-emitter layer and compound emitter layer form an emitter layer, the emitter layer being formed by a first emitter layer and a second emitter layer, and the second emitter layer being arranged on the first emitter layer, the first emitter layer including a first emitter transition layer, an intermediate layer, and a second emitter transition layer, and the first emitter transition layer is made of N$^-$GaAs, the second emitter transition layer is made of N$^-$GaAs and a material of the intermediate layer being high Aluminum content Al$_x$Ga$_{1-x}$As, and a lateral oxidation region being provided in the intermediate layer, and the lateral oxidation region is N$^-$AlGaAs, the high Aluminum content Al$_x$Ga$_{1-x}$As has an Aluminum content x ranging from 0.80 to 0.98;
a base layer located on the compound emitter layer;
a collector ledge layer located on the base layer;
a collector layer located on the collector ledge layer;
a lateral oxidation region provided in a portion of the compound emitter layer forming a current blocking region, and the outer region of the compound emitter layer surrounds inner region of the compound emitter layer, so that the inner region of the compound emitter layer forms a current aperture.

2. The heterojunction bipolar transistor as claimed in claim 1, wherein a first optional layer is provided between the first emitter transition layer and the intermediate layer, a second optional layer is provided between the second emitter transition layer and the intermediate layer, and the first optional layer and the second optional layer are made of N$^-$AlGaAs.

3. The heterojunction bipolar transistor as claimed in claim 1, wherein the thickness of the first emitter transition layer is 20-100 nm, and the doping material is Si and the Si doping concentration is reduced from 4e18 to 3e17 cm$^{-3}$; the thickness of the lateral oxidation region is 0.4-2.5 nm, and the doping material is Si and the Si doping concentration is 0-6e18 cm$^{-3}$; the thickness of the second emitter transition layer is 20-100 nm, and the doping material is Si and the Si doping concentration is 5e16-5e17 cm$^{-3}$.

4. The heterojunction bipolar transistor as claimed in claim 1, wherein the thickness of the first emitter transition layer is 50 nm, and the doping material is Si and the Si doping concentration is reduced from 4e18 to 3e17 cm$^{-3}$; the thickness of the lateral oxidation region is him, and the doping material is Si and the Si doping concentration is 4e18 cm$^{-3}$; the thickness of the second emitter transition layer is 50 nm, and the doping material is Si and the Si doping concentration is 3e17 cm$^{-3}$.

5. The heterojunction bipolar transistor as claimed in claim 1, wherein the collector ledge layer is ordered N$^-$InGaP and the energy band gap is approximately 1.85 eV.

6. The heterojunction bipolar transistor as claimed in claim 1, further include a base metal arranged on the collector ledge layer, and the base metal diffuses downward from the collector ledge layer into the base layer.

7. The heterojunction bipolar transistor as claimed in claim 1, further include a base metal arranged on the collector ledge layer, a etch through the collector ledge into the base layer is performed, and a base metal is deposited inside the etched region to connect to the base layer.

8. The heterojunction bipolar transistor as claimed in claim 1, wherein the material of the base layer is P$^+$GaAs, P$^+$InGaAs, or a combination thereof.

9. The heterojunction bipolar transistor as claimed in claim 1, further includes a collector cap layer arranged on the collector layer.

10. The heterojunction bipolar transistor as claimed in claim 9, wherein the material of the substrate is semi-insulating GaAs; the material of the sub-emitter layer is N$^+$GaAs; the material of the second emitter layer is N$^-$InGaP; the material of the base layer is of P$^+$GaAs; the material of the collector ledge layer is N$^-$InGaP; the material of the collector layer is N$^-$GaAs; the material of the collector cap layer is N$^+$GaAs or N$^+$InGaAs.

11. The heterojunction bipolar transistor as claimed in claim 10, wherein the thickness of the sub-emitter layer is 500-1000 nm, and the doping material is Si and the Si doping concentration is 1e18-2e19 cm$^{-3}$; the thickness of the second emitter layer is 30-60 nm, and the doping material is Si and the Si doping concentration is 5e16-5e17 cm$^{-3}$; the thickness of the base layer is 40-120 nm, and the doping material is C and the C doping concentration is 1e19-1e20 cm$^{-3}$; the thickness of the collector ledge layer is 0.4-100 nm, and the doping material is Si and the Si doping concentration is 5e16-5e17 cm$^{-3}$; the collector layer is composed of a first collector layer and a second collector layer, and the thickness of the first collector layer is 300-1200 nm, and the doping material is Si and the Si doping concentration is 1e17~2e14 cm$^{-3}$, the thickness of the second collector layer is 0-800 nm, and the doping material is Si and the Si doping concentration is 1e16-1e17 cm$^{-3}$; a collector transition layer, the collector transition layer extends the second collector layer, the thickness of the collector transition layer is 20-100 nm, and the doping material is Si and the Si doping concentration is larger than 1e19 cm$^{-3}$, the collector cap layer further extends the collector transition layer, the thickness of the collector cap layer is 20-100 nm, and the doping material is Si and the Si doping concentration is larger than 1e19 cm$^{-3}$.

12. The heterojunction bipolar transistor as claimed in claim 10, wherein the thickness of the sub-emitter layer is 800 nm, and the doping material is Si and the Si doping concentration is 4e18 cm$^{-3}$; the thickness of the second emitter layer is 50 nm, and the doping material is Si and the Si doping concentration is 3e17 cm$^{-3}$; the thickness of the base layer is 80 nm, and the doping material is C and the C doping concentration is 3e19 cm$^{-3}$; the thickness of the collector ledge layer is 5 nm, and the doping material is Si and the Si doping concentration is 3e17 cm$^{-3}$; the collector layer is composed of a first collector layer and a second collector layer, and the thickness of the first collector layer is 900 nm, and the doping material is Si and the Si doping concentration is 2e15 cm$^{-3}$, the thickness of the second collector layer is 300 nm, and the doping material is Si and the Si doping concentration is 5e16 cm$^{-3}$; a collector transition layer, the collector transition layer extends the second collector layer, the thickness of the collector transition layer is 50 nm, and the doping material is Si and the Si doping concentration is larger than 1e19 cm$^{-3}$, the collector cap layer further extends the collector transition layer, the thickness of the collector cap layer is 50 nm, and the doping material is Si and the Si doping concentration is larger than 1e19 cm$^{-3}$.

13. The heterojunction bipolar transistor as claimed in claim 10, wherein at the junction of the base layer and the second emitter layer, the N$^-$InGaP of the second emitter layer is either ordered or disordered.

14. The heterojunction bipolar transistor as claimed in claim 1, further has an isolation implant region arranged into the sub-emitter layer and into the substrate.

15. The heterojunction bipolar transistor as claimed in claim 14, wherein the isolation implant region is composed of Boron, Argon, Hydrogen, Helium, Aluminum, or a combination thereof.

16. The heterojunction bipolar transistor as claimed in claim 9, wherein the collector layer and the collector cap layer form a first mesa; the collector ledge layer, the base layer and the compound emitter layer form a second mesa, and the first mesa is smaller than the second mesa; an emitter metal located on the sub-emitter layer; a base metal located on the collector ledge and the base metal diffuses downward from the collector ledge layer into the base layer; and a collector metal located on the collector cap layer; whereby the electron current emitted from the emitter metal to the collector metal, and the current blocking region blocks the current, which only allows the current flow through the current aperture.

17. The heterojunction bipolar transistor as claimed in claim 16, wherein further has a back-side metal arranged on the second surface of the substrate, and the substrate and the sub-emitter layer have a back-side via hole for making the back-side metal electrically connect to the emitter metal by the back-side via hole.

18. The heterojunction bipolar transistor as claimed in claim 16, wherein an under bump metal is directly connected to the collector metal whereby the heat flow emitted from the heterojunction bipolar transistor can be conducted through the under bump metal into a bump.

* * * * *